(12) United States Patent
Deng

(10) Patent No.: US 7,062,407 B2
(45) Date of Patent: Jun. 13, 2006

(54) EFFICIENT BACKWARD RECURSION FOR COMPUTING POSTERIOR PROBABILITIES

(75) Inventor: Li Deng, Sammamish, WA (US)

(73) Assignee: Microsoft Corporation, Redmond, WA (US)

(*) Notice: Subject to any disclaimer, the term of this patent is extended or adjusted under 35 U.S.C. 154(b) by 0 days.

(21) Appl. No.: 10/939,640

(22) Filed: Sep. 13, 2004

(65) Prior Publication Data

US 2006/0075273 A1    Apr. 6, 2006

(51) Int. Cl.
*G06F 17/18* (2006.01)
(52) U.S. Cl. .................. 702/181; 702/179; 702/180; 702/181; 702/182; 714/794
(58) Field of Classification Search ............... 702/181; 714/794
See application file for complete search history.

(56) References Cited

U.S. PATENT DOCUMENTS

| | | | | |
|---|---|---|---|---|
| 5,721,746 A | * | 2/1998 | Hladik et al. ............ | 714/792 |
| 6,128,765 A | * | 10/2000 | Ross et al. ............... | 714/786 |
| 6,145,114 A | * | 11/2000 | Crozier et al. ............ | 714/794 |
| 6,813,743 B1 | * | 11/2004 | Eidson ..................... | 714/795 |

OTHER PUBLICATIONS

D. Broad and F. Clermont, Formant Estimation by Linear Transformation of the LPC Cepstrum, *J. Acout. Soc. Am.*, vol. 86, 1989, pp. 2013-2017.

L. Deng and D. Geisler, "A Composite Auditory Model for Processing Speech Sounds," *J. Acoust. Soc. Am.*, vol. 82, Dec. 1987, pp. 2001-2012.
H. Hermansky and D. Braod, "The Effective Second Formant F2 and the Vocal Tract Front-Cavity," *Proc. ICASSP*, vol. 1, 1989, pp. 480-483.
D. Klatt, "Software for a Cascade/Parallel Formant Synthesizer," *J. Acoust. Soc. Am.*, vol. 67, 1980, pp. 971-995.
S. McCandless, "An Algorithm for Automatic Formant Extraction Using Linear Prediction Spectra," *IEEE Trans. Acoust. Speech and Signal Proc.*, vol. 22, 1974, pp. 135-141.
C.S. Huang and H.C. Wang, "Bandwidth-Adjusted LPC Analysis for Robust Speech Recognition,;" *Pattern Recognition Letters*, vol. 24, 2003 pp. 1583-1587.

(Continued)

*Primary Examiner*—Marc S. Hoff
*Assistant Examiner*—Phuong Huynh
(74) *Attorney, Agent, or Firm*—Theodore M. Magee; Westman, Champlin & Kelly, P.A.

(57) ABSTRACT

A method and apparatus are provided that reduce the amount of memory needed to perform forward-backward recursion to identify posterior probabilities. Under the invention, a forward recursion is performed to identify forward recursion scores. The forward recursion scores are then used directly in a backward recursion to determine posterior probabilities for each state in a set of time frames. The usefulness of this invention is especially high when there is a large number of discrete states, such as when there are more than one set of discrete states in the model.

5 Claims, 3 Drawing Sheets

OTHER PUBLICATIONS

A.P. Dempster, N.M. Laird, and D.B. Rubin, "Maximum Likelihood from Incomplete Data Via the EM Algorithm," *J. Royal Statistical Society*, vol. 39, No. 1, pp. 1-38, 1997.

J. Holmes, W. Holmes, and P. Garner, Using Format Frequencies in Speech Recognition,: in *Proc. Eurospeech*, Rhodes, Greece, Sep., 1997, pp. 2083-2086.

Seide, F. et al., "Coarticulation Modeling by Embedding a Target-Directed Hidden Trajectory Model into HMM -Map Decoding and Evaluation," *Proc. ICASSP*, 2003, pp. 748-751.

L. Deng, et al., "Spontaneous Speech Recognition Using a Statistical Coarticulatory Model for the Vocal-Tract-Dynamics," *J. Acoust. Soc. Am.*, vol. 108, 2000, pp. 3036-3048.

Sun, J. et al., "Data-Driven Model Construction for Continuos Speech Recognition Using Overlapping Articulatory Features," *Proc. ICSLP*, 2000, vol. 1, pp. 437-440.

S. Dusan et al., "Recovering Vocal Tract Shapes From MFCC Parameters," *Proc. ICSLP*, 1998, pp. 3087-3090.

L. Deng, et al., "Tracking Vocal Tract Resonance Using an Analytical Nonlinear Predictor and a Target-Guided Temporal Constraint," *Proc. Eurospeech*, 2003, vol. I, pp. 73-76.

A. Acero, "Formant Analysis and Synthesis Using Hidden Markov Models," in *Proc. Eurospeech*, Budapest, Sep. 1999.

Bazzi, I. et al., "An Expectation Maximization Approach for Formant Tracking Using a Parameter-Free Non-Linear Predictor," *Proc. ICASSP*, Hong Kong, Apr. 2003.

Bruce, I. et al., "Robust Formant Tracking in Noise," *Proc. ICASSP*, Orlando, FL, 2002, pp. 281-284.

Deng, Li et al., Speech Processing—*A Dynamic and Optimization-Oriented Approach*, chapters 7 and 10, Marcel Dekker Inc., New York, NY, 2003.

\* cited by examiner

EFFICIENT BACKWARD RECURSION FOR COMPUTING POSTERIOR PROBABILITIES

BACKGROUND OF THE INVENTION

The present invention relates to posterior probabilities for discrete hidden states. In particular, the present invention relates to forward-backward recursion for determining posterior probabilities.

In recognition tasks, such as speech recognition, facial recognition, speaker recognition, and hand writing recognition, it is common to need to identify a sequence of discrete hidden states from a sequence of observed values. Typically, each observed value is associated with a time frame t and identifying the sequence of discrete hidden states involves selecting one hidden state s out of a set of N possible states S at each time frame.

To identify the sequence of hidden states, a posterior probability $p(s_{n,t}|o_1^T)$ is often determined for each possible state $s_n$ in each time frame t. One technique for determining these posterior probabilities is known as forward-backward recursion. In the forward-backward recursion, a forward recursion is first performed in which a score for a state in a given frame is based upon scores for each of the states in the preceding frame. Thus, the scores are built in a left-right manner in which scores for the first frame must be determined before scores for the subsequent frames. During the backward recursion, the score for a state in a frame is dependent on the score of all of the states in the next frame. Thus, the states are scored from right-to-left. The scores from the forward recursion and the backward recursion for a given state in a given time frame are then combined to give the posterior probability for that state in that time frame.

In the past, the forward-backward recursion has required that three sets of values be determined for each state at each time frame. Specifically, a forward recursion score, a backward recursion score and a posterior probability has been determined for each state at each time frame. For systems that have a large number of states, for instance systems that use 25 million states in each time frame, this prior art technique has required a large amount of memory. For example, under the prior art, for 25 million states and a thousand frames of data, 75 billion values have been stored consisting of 25 billion forward recursion values, 25 billion backward recursion values, and 25 billion posterior probabilities. This large memory requirement is undesirable. As such, a more efficient method of performing forward-backward recursion to determine posterior probabilities is needed.

SUMMARY OF THE INVENTION

A method and apparatus are provided that reduce the amount of memory needed to perform forward-backward recursion to identify posterior probabilities. Under the invention, a forward recursion is performed to identify forward recursion scores. The forward recursion scores are then used in a backward recursion to determine posterior probabilities for each state in a set of time frames.

DETAILED DESCRIPTION OF ILLUSTRATIVE EMBODIMENTS

Figure 1:
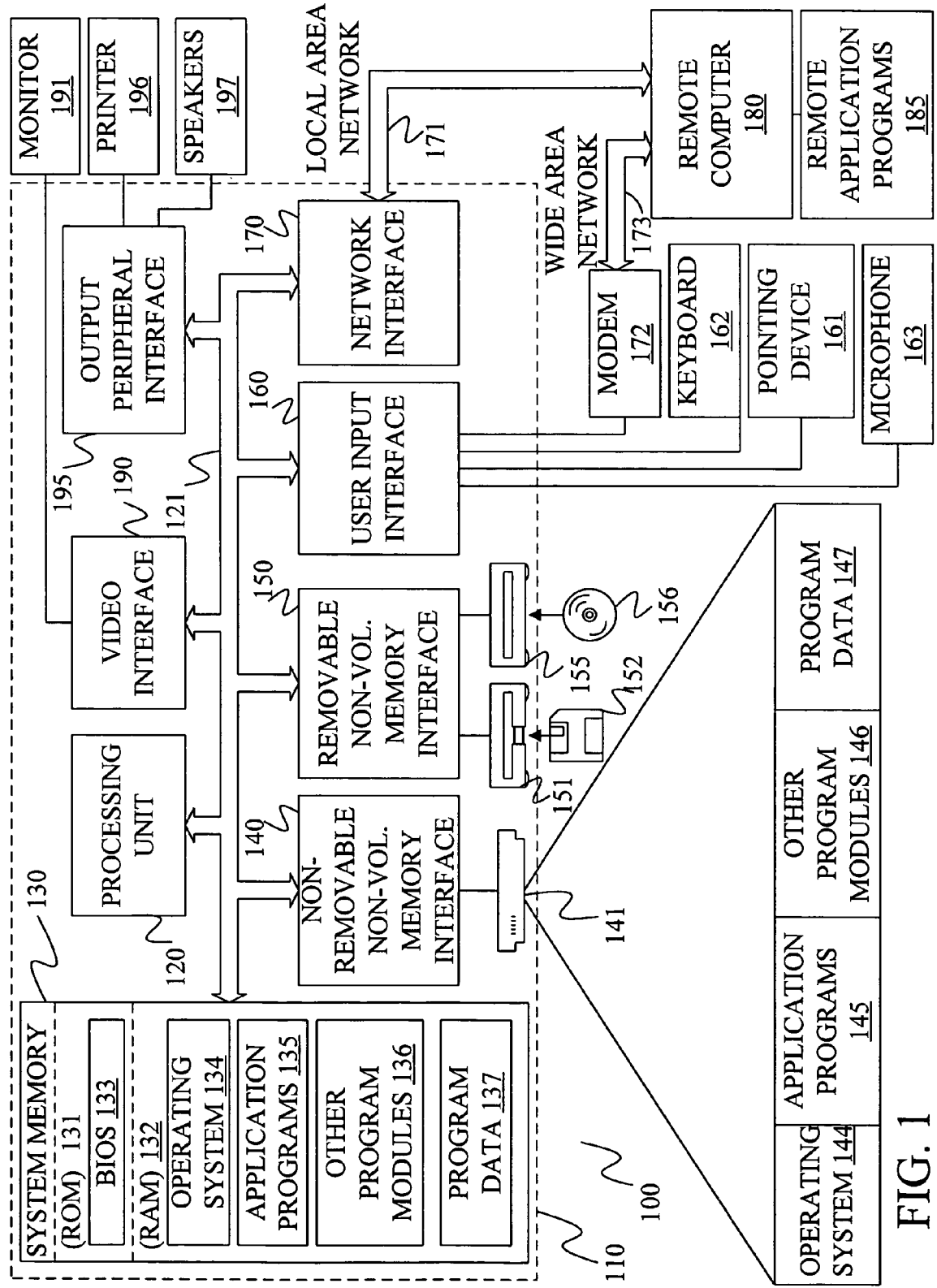
FIG. 1 is a block diagram of a general computing environment in which embodiments of the present invention may be practiced.

FIG. 1 illustrates an example of a suitable computing system environment 100 on which the invention may be implemented. The computing system environment 100 is only one example of a suitable computing environment and is not intended to suggest any limitation as to the scope of use or functionality of the invention. Neither should the computing environment 100 be interpreted as having any dependency or requirement relating to any one or combination of components illustrated in the exemplary operating environment 100.

The invention is operational with numerous other general purpose or special purpose computing system environments or configurations. Examples of well-known computing systems, environments, and/or configurations that may be suitable for use with the invention include, but are not limited to, personal computers, server computers, hand-held or laptop devices, multiprocessor systems, microprocessor-based systems, set top boxes, programmable consumer electronics, network PCs, minicomputers, mainframe computers, telephony systems, distributed computing environments that include any of the above systems or devices, and the like.

The invention may be described in the general context of computer-executable instructions, such as program modules, being executed by a computer. Generally, program modules include routines, programs, objects, components, data structures, etc. that perform particular tasks or implement particular abstract data types. The invention is designed to be practiced in distributed computing environments where tasks are performed by remote processing devices that are linked through a communications network. In a distributed computing environment, program modules are located in both local and remote computer storage media including memory storage devices.

With reference to FIG. 1, an exemplary system for implementing the invention includes a general-purpose computing device in the form of a computer 110. Components of computer 110 may include, but are not limited to, a processing unit 120, a system memory 130, and a system bus 121 that couples various system components including the system memory to the processing unit 120. The system bus 121 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

Computer 110 typically includes a variety of computer readable media. Computer readable media can be any available media that can be accessed by computer 110 and includes both volatile and nonvolatile media, removable and non-removable media. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data.

Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by computer 110. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer readable media.

The system memory 130 includes computer storage media in the form of volatile and/or nonvolatile memory such as read only memory (ROM) 131 and random access memory (RAM) 132. A basic input/output system 133 (BIOS), containing the basic routines that help to transfer information between elements within computer 110, such as during start-up, is typically stored in ROM 131. RAM 132 typically contains data and/or program modules that are immediately accessible to and/or presently being operated on by processing unit 120. By way of example, and not limitation, FIG. 1 illustrates operating system 134, application programs 135, other program modules 136, and program data 137.

The computer 110 may also include other removable/non-removable volatile/nonvolatile computer storage media. By way of example only, FIG. 1 illustrates a hard disk drive 141 that reads from or writes to non-removable, nonvolatile magnetic media, a magnetic disk drive 151 that reads from or writes to a removable, nonvolatile magnetic disk 152, and an optical disk drive 155 that reads from or writes to a removable, nonvolatile optical disk 156 such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 141 is typically connected to the system bus 121 through a non-removable memory interface such as interface 140, and magnetic disk drive 151 and optical disk drive 155 are typically connected to the system bus 121 by a removable memory interface, such as interface 150.

The drives and their associated computer storage media discussed above and illustrated in FIG. 1, provide storage of computer readable instructions, data structures, program modules and other data for the computer 110. In FIG. 1, for example, hard disk drive 141 is illustrated as storing operating system 144, application programs 145, other program modules 146, and program data 147. Note that these components can either be the same as or different from operating system 134, application programs 135, other program modules 136, and program data 137. Operating system 144, application programs 145, other program modules 146, and program data 147 are given different numbers here to illustrate that, at a minimum, they are different copies.

A user may enter commands and information into the computer 110 through input devices such as a keyboard 162, a microphone 163, and a pointing device 161, such as a mouse, trackball or touch pad. Other input devices (not shown) may include a joystick, game pad, satellite dish, scanner, or the like. These and other input devices are often connected to the processing unit 120 through a user input interface 160 that is coupled to the system bus, but may be connected by other interface and bus structures, such as a parallel port, game port or a universal serial bus (USB). A monitor 191 or other type of display device is also connected to the system bus 121 via an interface, such as a video interface 190. In addition to the monitor, computers may also include other peripheral output devices such as speakers 197 and printer 196, which may be connected through an output peripheral interface 195.

The computer 110 is operated in a networked environment using logical connections to one or more remote computers, such as a remote computer 180. The remote computer 180 may be a personal computer, a hand-held device, a server, a router, a network PC, a peer device or other common network node, and typically includes many or all of the elements described above relative to the computer 110. The logical connections depicted in FIG. 1 include a local area network (LAN) 171 and a wide area network (WAN) 173, but may also include other networks. Such networking environments are commonplace in offices, enterprise-wide computer networks, intranets and the Internet.

When used in a LAN networking environment, the computer 110 is connected to the LAN 171 through a network interface or adapter 170. When used in a WAN networking environment, the computer 110 typically includes a modem 172 or other means for establishing communications over the WAN 173, such as the Internet. The modem 172, which may be internal or external, may be connected to the system bus 121 via the user input interface 160, or other appropriate mechanism. In a networked environment, program modules depicted relative to the computer 110, or portions thereof, may be stored in the remote memory storage device. By way of example, and not limitation, FIG. 1 illustrates remote application programs 185 as residing on remote computer 180. It will be appreciated that the network connections shown are exemplary and other means of establishing a communications link between the computers may be used.

Figure 2:
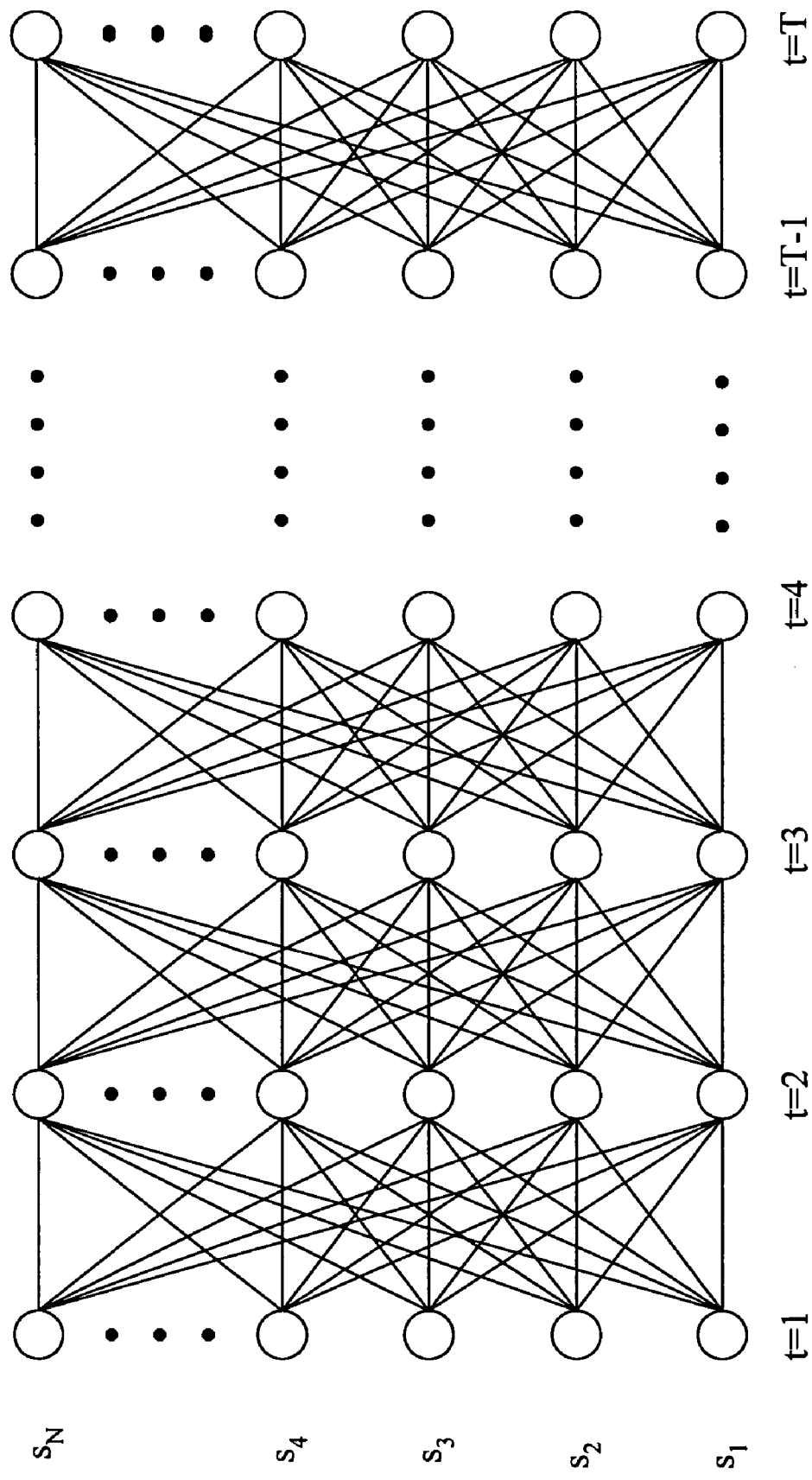
FIG. 2 is a state diagram representing a discrete state model to which forward-backward recursion of the present invention may be applied.

FIG. 2 provides a state diagram that represents an example of a discrete state model that the present invention can be applied to. In the state diagram, the model is allowed to occupy one of a set of N states $s_1$ through $s_N$ at each of a set of time frames from t=1 to t=T. Between time frames, the model allows transitions from each state of the current time frame to any of the other states in the next time frame. By selecting a state in each time frame, a sequence of states can be identified. Typically, the sequence of states represents a sequence of hidden value such as discretized formants or phonetic units. Each time frame is associated with an observation value, which typically takes the form of a vector. Thus, identifying the sequence of states amounts to identifying a hidden value for each observation value in the sequence of observation values.

The present invention provides a method for identifying a posterior probability of each state in each time frame given the sequence of observation vectors. This posterior probability is defined as:

$$\gamma_t(s_n) = p(s_{n,t}|o_1^T) \qquad \text{Eq. 1}$$

where $\gamma_t(s_n)$ represents the posterior probability for state $s_n$ at time t, and $p(s_{n,t}|o_1^T)$ represents the probability of state $s_n$ at time t given the entire sequence of observation vectors $o_1^T$ from time t=1 to time t=T.

In the past, the posterior probabilities were determined using a forward-backward recursion. The forward recursion was defined as:

$$\alpha_{t+1}(s_{n'}) = \sum_{n=1}^{N} p(o_{t+1}|s_{n',t+1}) p(s_{n',t+1}|s_{n,t}) \alpha_t(s_n) \quad \text{Eq. 2}$$

where $\alpha(s_{n',t+1})$ is a forward recursion score for state $s_{n'}$ at time t+1, $p(o_{t+1}|s_{n',t+1})$ is an observation probability for observing value $o_{t+1}$ at time t+1 given state $s_{n'}$ at time t+1, $p(s_{n',t+1}|s_{n,t})$ is a transition probability for transitioning from state $s_n$ at time t to state $s_{n'}$ at time t+1 and $\alpha_t(s_n)$ is the forward recursion score for state $s_n$ at time t. The summation on the right-hand side of Equation 2 is taken over all states in time frame t.

The backward recursion of the prior art is defined as:

$$\beta_t(s_{n'}) = \sum_{n=1}^{N} p(o_t|s_{n',t}) p(s_{n',t}|s_{n,t+1}) \beta_{t+1}(s_n) \quad \text{Eq. 3}$$

where $\beta_t(s_n)$ is the backward recursion score for state $s_{n'}$ at time t, $p(o_t|s_{n',t})$ is the observation probability of observing observation value $o_t$ given state $s_{n'}$ at time t, $p(s_{n',t}|s_{n,t+1})$ is the transition probability of state $s_{n'}$ at time t given state $s_n$ at time t+1, and $\beta_{t+1}(s_n)$ is the backward recursion score for state $s_n$ at time t+1.

The backward and forward recursion scores were combined under the prior art to form the posterior probability as:

$$\gamma_t(s_n) = \frac{\alpha_t(s_n) \beta_t(s_n)}{\sum_n \alpha_t(s_n) \beta_t(s_n)} \quad \text{Eq. 4}$$

The technique of the prior art described above requires the allocation of a large amount of memory. In particular, it requires memory to be allocated for each of the forward recursion values, backward recursion values, and posterior probabilities. In some systems, where there are millions of states at each time frame, a large amount of memory must be allocated to accommodate all of these values. This can occur, for example, when the number of states in each frame is equal to the number of possible combinations of discrete values for two different variables. For instance, if each state represents the combination of a phonetic unit that can take one of twenty-seven values and a vocal tract resonance vector that can take one of seventy-five million values, there would be over two billion states per frame.

The present invention reduces the amount of memory that is required and the amount of computations that are performed by integrating the determination of the posterior probability into a backward recursion, thereby eliminating the need to store backward recursion values and eliminating the need to perform the calculations of Equation 3 and Equation 4 separately.

Figure 3:
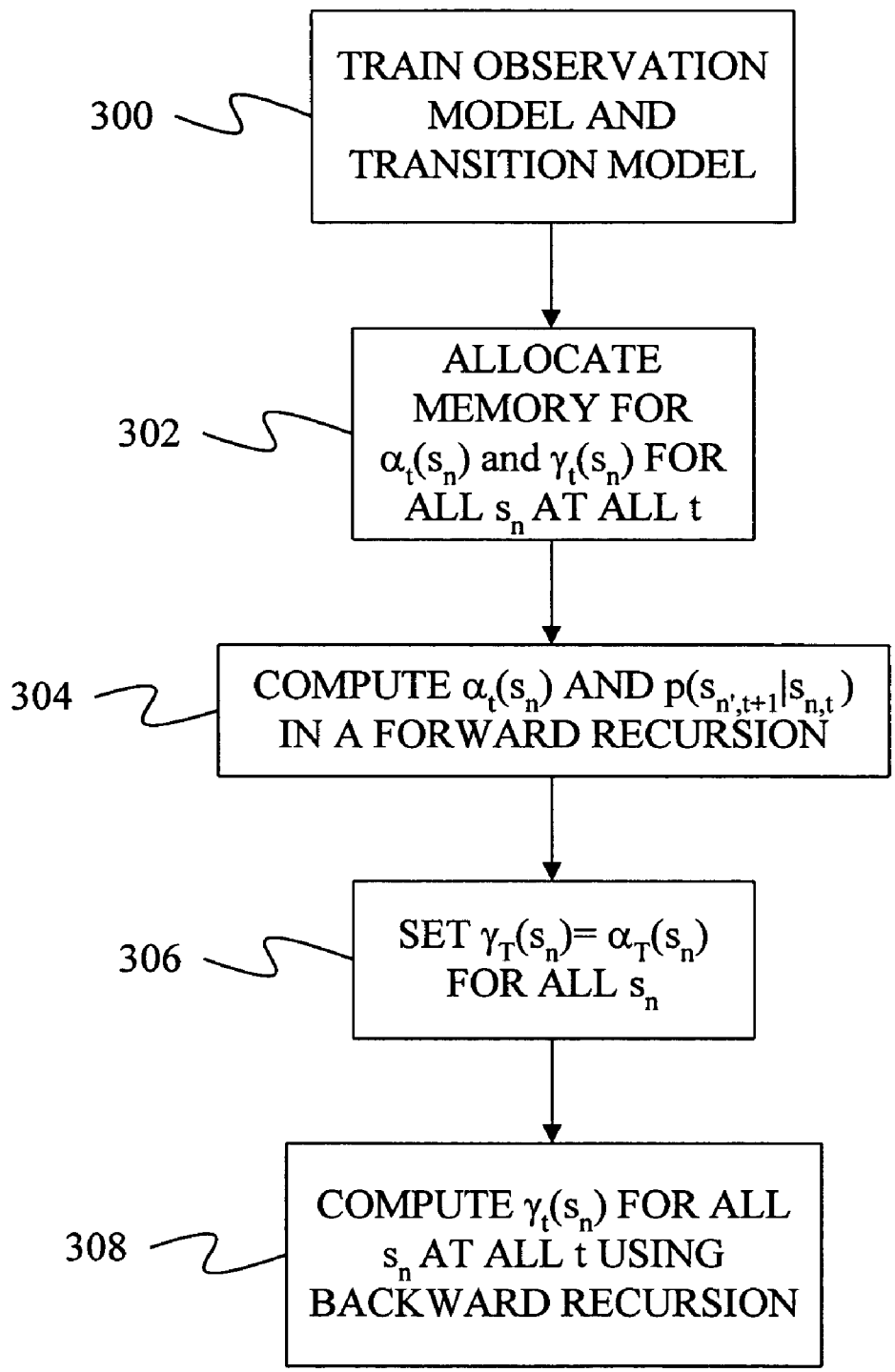
FIG. 3 is a flow diagram of one embodiment of a method of the present invention.

FIG. 3 provides a flow diagram of a method of performing a forward-backward recursion under the present invention, which reduces the amount of memory required.

In step 300 of FIG. 3, parameters for the observation model and the transition model are trained. Under one embodiment, the observation probability is modeled as a Gaussian distribution such that:

$$p(o_t|s_{n,t}) = N(o_t; \mu_n, D) \quad \text{Eq. 5}$$

where $p(o_t|s_{n,t})$ is the observation probability of observing value $o_t$ given state $s_n$ at time t, $\mu$ is the mean of the normal distribution, and D is the covariance matrix of the normal distribution.

In one embodiment, the transition probability is also modeled as a Gaussian such that:

$$p(s_{n',t+1}|s_{n,t}) = N(s_{n',t+1}; m_n, B) \quad \text{Eq. 6}$$

where $p(s_{n',t+1}|s_{n,t})$ is the transition probability of transitioning to state $s_{n'}$ at time t+1 given state $s_n$ at time t, $m_n$ is the mean of the normal distribution and B is the covariance matrix.

Methods for training the model parameters $\mu_n, D, m_n, B$ are well known in the art and include the EM algorithm and heuristic techniques.

At step 302, memory is allocated for forward recursion scores $\alpha_t(s_n)$ and posterior probabilities $\gamma_t(s_n)$ for all $s_n$ at all times t. Although the memory allocation step is shown as occurring after the model-training step, those skilled in the art will recognize that the memory may be allocated before training the observation model and the transition model. Note that memory is not allocated for backward recursion scores that are separate from the posterior probabilities.

At step 304, forward recursion scores are computed for each state $s_n$ at each time frame t using Equation 2 above. During the computation of the forward recursion scores, the transition probabilities are determined. These transition probabilities may be stored for later use.

At step 306, the posterior probability for all the states $s_n$ at time T are set equal to the forward recursion score for those respective states at time T. At step 308, the posterior probability $\gamma_t(s_n)$ is determined for all $s_n$ at all times t using a backward recursion defined as:

$$\gamma_t(s_n) = \sum_{n'=1}^{N} \frac{\alpha_t(s_n) p(s_{n',t+1}|s_{n,t})}{\sum_{n=1}^{N} \alpha_t(s_n) p(s_{n',t+1}|s_{n,t})} \gamma_{t+1}(s_{n'}) \quad \text{Eq. 7}$$

where $\gamma_t(s_n)$ is the posterior probability for state $s_n$ at time t, and $\gamma_{t+1}(s_{n'})$ is the posterior probability determined for state $s_{n'}$ at time t+1. In Equation 7, $\alpha_t(s_n)$ and $p(s_{n',t+1}|s_{n,t})$ were both determined during the forward recursion.

Thus, under the present invention, the forward recursion is performed using Equation 2 and the backward recursion is performed using Equation 7 without the need to determine the backward recursion values $\beta_t(s_{n'})$ as found in Equation 3 of the prior art. As a result, fewer values need to be stored thereby reducing the amount of memory that must be allocated. In addition, fewer computations need to be performed since Equation 3 is not needed under the present invention.

Although the present invention has been described with reference to particular embodiments, workers skilled in the art will recognize that changes may be made in form and detail without departing from the spirit and scope of the invention.

What is claimed is:

1. A method of determining a posterior probability for each of a set of discrete states at each of a set of time frames, the method comprising:

performing a forward recursion to determine a forward recursion score for each discrete state in each time frame; and using the forward recursion scores in a backward recursion to generate at least one posterior probability wherein performing a backward recursion comprises:

determining a posterior probability for each discrete state in a time frame; and using the posterior probabilities determined for the time frame to determine posterior probabilities for each discrete state in another time frame.

2. The method of claim 1 wherein determining posterior probabilities for each discrete state in another time frame comprises determining posterior probabilities for each discrete state in an earlier time frame.

3. The method of claim 2 wherein determining posterior probabilities for each discrete state in an earlier time frame comprises summing a function over the discrete states in the time frame.

4. The method of claim 1 wherein performing a backward recursion comprises utilizing a transition probability.

5. The method of claim 1 wherein performing a forward recursion comprises determining an observation probability for each discrete state.

* * * * *